(12) United States Patent
Chen et al.

(10) Patent No.: US 12,189,440 B2
(45) Date of Patent: Jan. 7, 2025

(54) INFORMATION HANDLING SYSTEM CARRIER

(71) Applicant: Dell Products L.P., Round Rock, TX (US)

(72) Inventors: Zhao Chen, Wuxi (CN); Harris Di, Shanghai (CN); John C. Donachy, Austin, TX (US); Amrita Sidhu Maguire, Cedar Park, TX (US); Weidong Zuo, Shrewsbury, MA (US); Libertad Paloma Escobar Carrizales, Sunset Valley, TX (US); Peter A. Kaltenbach, Austin, TX (US); Kevin M. Keller, Austin, TX (US); Brad P. Collins, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 260 days.

(21) Appl. No.: 17/990,002

(22) Filed: Nov. 18, 2022

(65) Prior Publication Data

US 2024/0168528 A1 May 23, 2024

(51) Int. Cl.
- *G06F 1/18* (2006.01)
- *H05K 7/14* (2006.01)
- *H05K 7/20* (2006.01)

(52) U.S. Cl.
CPC .......... *G06F 1/185* (2013.01); *H05K 7/1417* (2013.01); *H05K 7/20709* (2013.01)

(58) Field of Classification Search
CPC combination set(s) only.
See application file for complete search history.

(56) References Cited

U.S. PATENT DOCUMENTS

| | | | |
|---|---|---|---|
| 6,084,768 A * | 7/2000 | Bolognia | G11B 33/08 |
| 7,321,489 B2 | 1/2008 | McAlister | |
| 7,554,811 B2 * | 6/2009 | Scicluna | G11B 33/08 |
| | | | 361/759 |
| 7,626,810 B1 * | 12/2009 | Kim | G06F 1/187 |
| | | | 361/679.33 |
| 8,248,775 B2 * | 8/2012 | Zhang | G11B 33/124 |
| | | | 361/679.01 |
| 8,749,966 B1 | 6/2014 | Boudreau et al. | |
| 9,232,678 B2 | 1/2016 | Bailey et al. | |
| 9,456,519 B2 | 9/2016 | Bailey et al. | |
| 9,706,677 B2 | 7/2017 | Cravens et al. | |
| 10,039,204 B2 | 7/2018 | Kyle et al. | |
| 10,096,344 B2 * | 10/2018 | Okamoto | H05K 7/14 |
| 10,372,175 B2 * | 8/2019 | Ehlen | H05K 7/1489 |

(Continued)

*Primary Examiner* — Lisa Lea-Edmonds
(74) *Attorney, Agent, or Firm* — Zagorin Cave LLP; Robert W. Holland

(57) ABSTRACT

An information handling system bay accepts plural communication carriers having storage communication support, such as in compliance with OCP3.0. The communication carrier has a support structure to support processing components, such as a network interface controller coupled to a printed circuit board, and coupled within the bay by a latch having a member extending from one end to engage the bay housing and latching an opposite chamfered end with a pin coupled to a spring loaded button. A press on the button away from the latch releases the chamfered end from the pin so support structure member is free from the housing bay to remove the communication carrier.

20 Claims, 8 Drawing Sheets

(56) References Cited

U.S. PATENT DOCUMENTS

| | | | |
|---|---|---|---|
| 10,932,383 B2 * | 2/2021 | Ehlen | H05K 7/1487 |
| 10,936,527 B1 * | 3/2021 | Chen | G06F 1/185 |
| 10,939,573 B1 * | 3/2021 | Liao | H01R 13/62983 |
| 11,317,529 B2 * | 4/2022 | Chang | G06F 1/187 |
| 11,558,974 B2 * | 1/2023 | Escamilla | H05K 7/1487 |
| 11,606,874 B2 * | 3/2023 | Lewis | G06F 1/185 |
| 2021/0068296 A1 * | 3/2021 | Liao | H01R 13/62983 |
| 2022/0394871 A1 * | 12/2022 | Escamilla | H05K 5/0221 |
| 2024/0168528 A1 * | 5/2024 | Chen | H05K 7/20709 |
| 2024/0237259 A9 * | 7/2024 | Lin | H05K 7/1489 |

\* cited by examiner

INFORMATION HANDLING SYSTEM CARRIER

BACKGROUND OF THE INVENTION

Field of the Invention

The present invention relates in general to the field of information handling systems, and more particularly to an information handling system carrier to support Open Compute Project 3.0 form factor.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems integrate processing components that cooperate to process information. For example, a processor interfaces with a memory to execute instructions that perform a desired function. One type of information handling system is a server information handling system, which generally interfaces with a network to serve information requests by client information handling systems. Server information handling systems are the engines behind e-commerce and the backbones of many enterprises. The most basic function of a server information handling system is to communicate information, either by accepting the information from clients to store in memory or retrieving information from memory to communicate to clients. A typical server information handling system will continuously and simultaneously communicate with a large number of clients and with storage resources. Generally, communication on such a large scale is managed through standardized cable interfaces and communication protocols.

One standardized communication cable interface is provided by the Open Compute Project (OCP), which has recently defined an OCP3.0 form factor to support next generation storage with a carrier design for modular network interface controllers (NIC). A typical server information handling system will have multiple communication carriers coupled at a front or rear face and stacked in vertical and/or horizontal configurations. Each OCP communication carrier includes, for instance, a NIC that supports plural SAS ports to communicate information with storage. Dense vertical and horizontal stacking of carriers can create thermal management difficulties in dissipation of excess thermal energy associated with NIC operations. Deployed OCP carriers tend to have difficulty achieving high density current calibration file (CCF) systems and often fit into a server information handling system environment with awkward coupling arrangements. For example, one OCP carrier has a thumbscrew that tightens the carrier front face into position, which is difficult to manipulate and lacks any space to include a label. In that example, an 84.6 mm width results so that the carrier does not fit in a 2 U chassis with a vertical orientation and is not optimized for a horizontal orientation. Venting to remove excess thermal energy typically is provided through the main server chassis, which tends to impact thermal transfer effectiveness. Alternative OCP carriers have a hinged front latch that opens to allow access to the carrier and closes to couple the carrier in place. The latch is held in place by a clip at one side that engages with the carrier housing. The clip tends to be difficult to access and the carrier has an 84.2 mm width that prevents 2 U chassis vertical stacking and is suboptimal for horizontal stacking. In another OCP carrier, a top ejector for the SAS cable tends to interfere with the cable so that cable interactions are hampered after the carrier is installed.

SUMMARY OF THE INVENTION

Therefore, a need has arisen for a system and method which couples an information handling system carrier in place with adequate physical clearances and sufficient thermal management.

In accordance with the present invention, a system and method are provided which substantially reduce the disadvantages and problems associated with previous methods and systems of coupling a communication carrier in an information handling system bay. A latch coupled to an axle at one side of the communication carrier engages a pin at an opposite side, the pin coupled to a button that moves laterally so that a press of the button removes the pin from the latch. A member of the latch proximate the axle extends out from the communication carrier to engage the bay when the latch couples with the pin.

More specifically, an information handling system processes information with processing components disposed in a housing, such as a processor and memory, and communicates the information through a network interface controller of a communication carrier that couples into a bay of the information handling system. The communication carrier has a support structure that couples to a printed circuit board having the network interface controller and has a latch assembly at a front face to secure into and release from the information handling system bay. The latch assembly couples a latch to an axle at one side of the support structure and selectively couples to a button and pin assembly on an opposite side. The button has a spring mount that moves the pin away from the latch and releases the latch from the pin so that the latch can rotate to a release position at which a pull on the latch will translate to removal of the communication carrier. A member extend from the latch proximate the axle engages with the bay when the latch engages the pin in the secured position so that the communications carrier is secured in the bay. The support structure front face has vent openings that pass air through to the processing components within the communications carrier to remove excess thermal energy.

The present invention provides a number of important technical advantages. One example of an important technical advantage is that a slim 17.8 mm OCP3.0 communication carrier vertically stacks in 2 U chassis bays to provide a high density of communication capability. Venting formed in the front face of the carrier support structure improves thermal performance with greater airflow volumes and reduced operating temperatures. A latch engagement with a flexible button having a pin that moves laterally offers a compact and readily accessible release mechanism to remove the communication carrier from within an information handling system bay.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Communication carriers couple in an information handling system bay with a front face latch assembly and laterally moveable button and pin. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
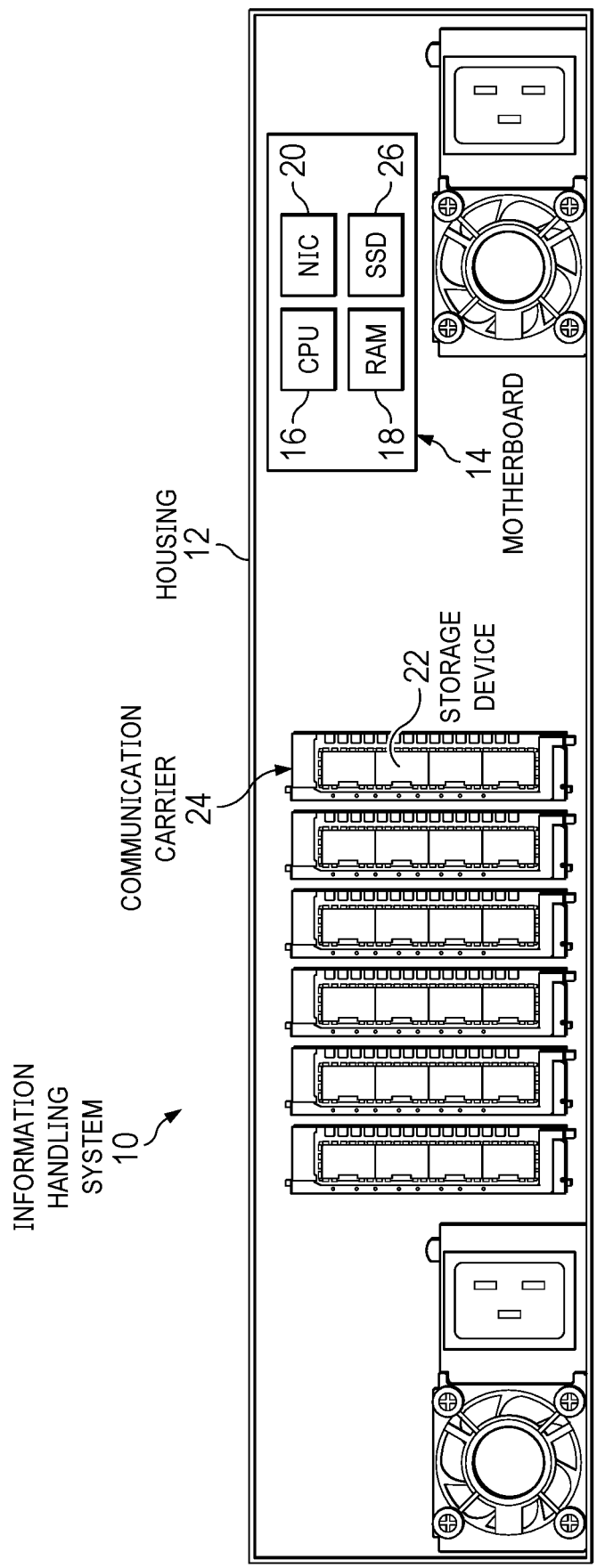
FIG. 1 depicts a block diagram of an information handling system having a bay that accepts plural communication carriers to support storage functions.

Referring now to FIG. 1, a block diagram depicts an information handling system 10 having a bay that accepts plural communication carriers 24 to support storage functions. In the example embodiment, information handling system 10 is a server information handling system providing a Serial Attached SCSI (SAS) Current Calibration Files (CCF) platform having communication carriers 24 compliant with OCP3.0. Server information handling system 10 is built in a housing 12 that includes a bay to accept modules. A motherboard 14 interfaces a central processing unit (CPU) 16 with a random access memory (RAM) 18 so that CPU 16 executes instructions to process information with the instructions and information stored in RAM 18. A network interface controller (NIC) 20 provides network communications, such as through Ethernet and SAS cable interfaces. A solid state drive (SSD) 26 provides persistent storage of information. Communication carriers 24 include a storage device 22 that interfaces with motherboard 14 through a bus to provide a storage function, such as plural cable ports that provide SAS access to external cables or solid state drives. Communication carrier 24 provides a physical coupling of storage device 22 in a bay of information handling system 10. Communication carriers 24 may be arranged in a variety of manners, such as vertically-stacked in a 2 U space as shown with an 82 mm pitch for each module, or horizontally stacked in heights of three with a 17.8 mm height for each module in a 1.5 U space. Other types of arrangements may be supported.

Figure 2:
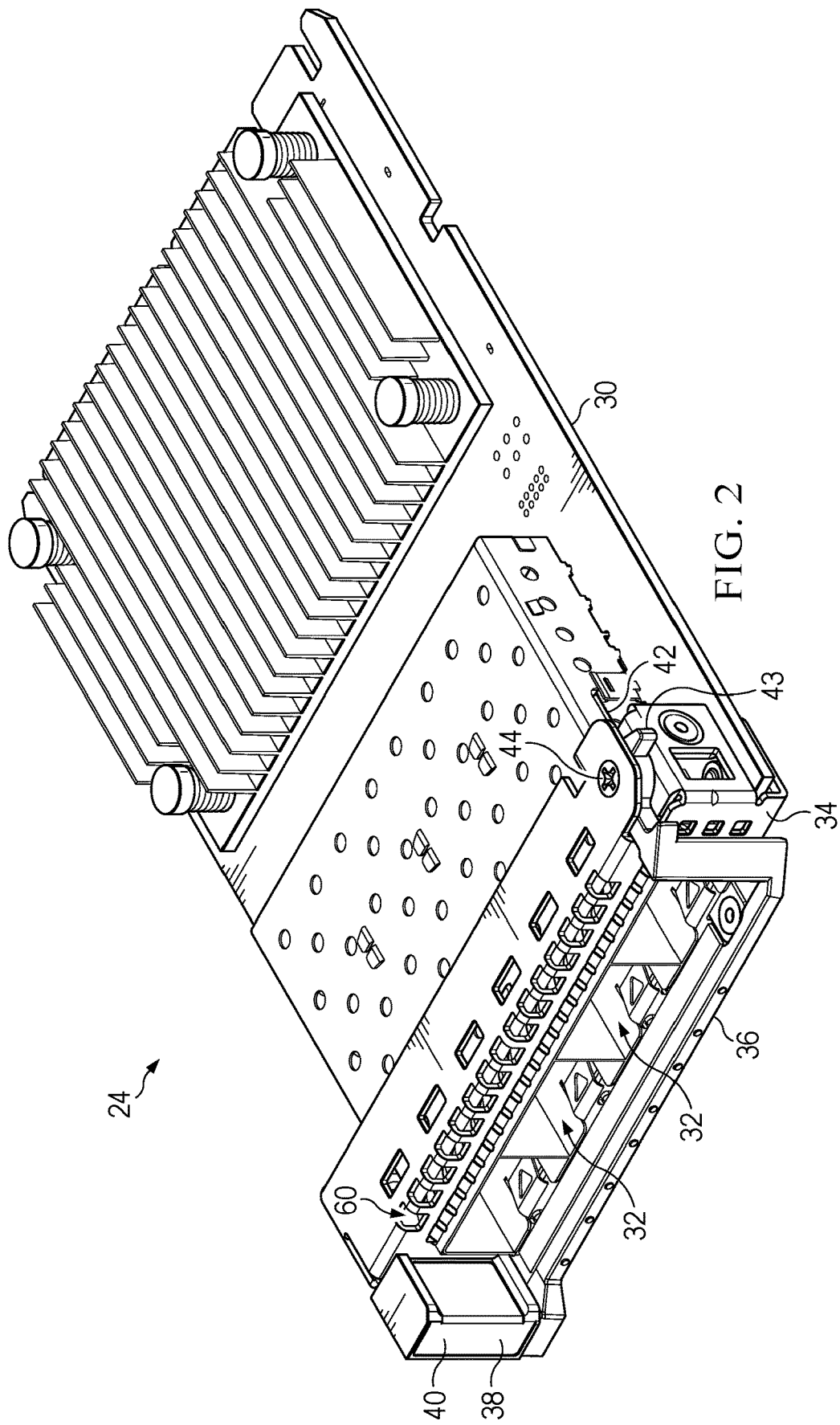
FIG. 2 depicts a front perspective view of communication carrier having storage communication ports and a latch assembly to secure to an information handling system housing bay.

Referring now to FIG. 2, a front perspective view depicts communication carrier 24 having storage communication ports 32 and a latch assembly to secure to an information handling system housing bay. In the example depiction, communication carrier 24 has a latch 36 in a secure position coupled in place by a button assembly 38. Button assembly 38 has a label button surface 40 that accepts a label identifying the capabilities of the storage processing components held in communication carrier 24. When an end user presses on label button surface 40 laterally and away from the communication ports 32, latch 36 is released to rotate outward towards a release position. A support structure 34 couples with latch 36 and a printed circuit board 30 that interfaces storage processing components with storage communication ports 32. For instance, printed circuit board 30 holds a network interface controller (NIC) that interfaces SAS communication ports 32 with a bus of an information handling system when communication carrier 24 is inserted into a bay. In the example embodiment, supporting structure 34 has vents 60 formed in an upper front surface that promote cooling airflow across the processing components, which are shown with a heat sink attached.

Supporting structure 34 holds an axle 44 about which latch 36 rotates between the secure and release positions. A torsion spring is coupled around axle 44 and works to bias latch 36 towards the release position. When button assembly 38 is actuated with a press at the button surface 40 laterally and away from axle 44, torsion spring 42 pops out latch 36 for access by an end user's fingers. In the release position, latch 36 provides a member that the end user can pull on to pull communication carrier 24 out of the information handling system bay. A securing member 43 extends out from latch 36 at an opposite side of axle 44 from button assembly 38 when latch 36 rotates to the secure position. Securing member 43 engages within the server information handling system bay to hold communication carrier 24 in place in the bay. When latch 36 rotates from the secure position to the release position, securing member 43 rotates about axle 44 to recede into supporting structure 34 and away from the information handling system bay so that communication carrier 24 may be pulled out of the bay.

Figure 3B:
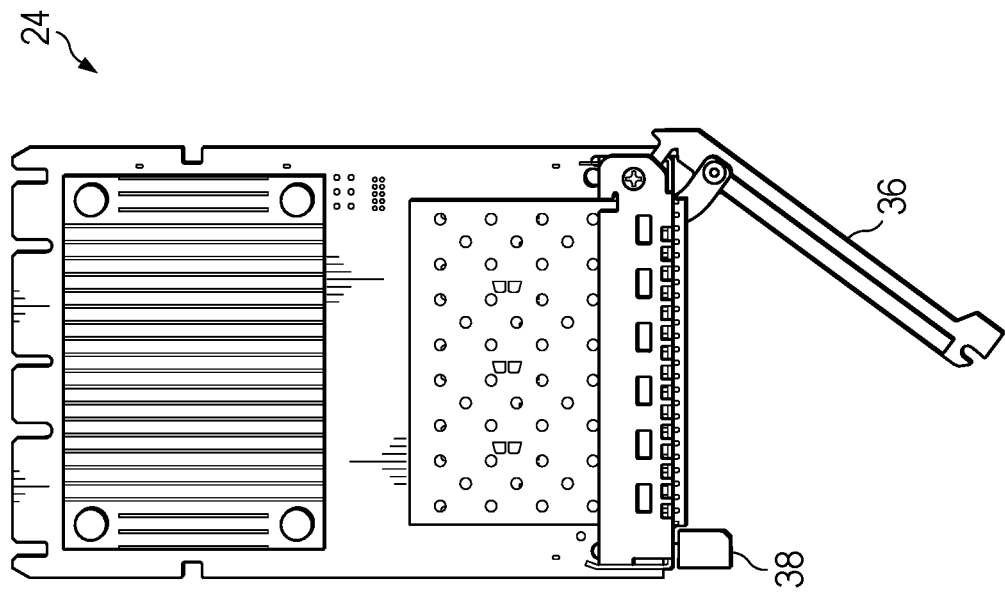
FIGS. 3A and 3B depict an upper view communication carriers having a latch assembly in a secure position and a release position.
Figure 3A:
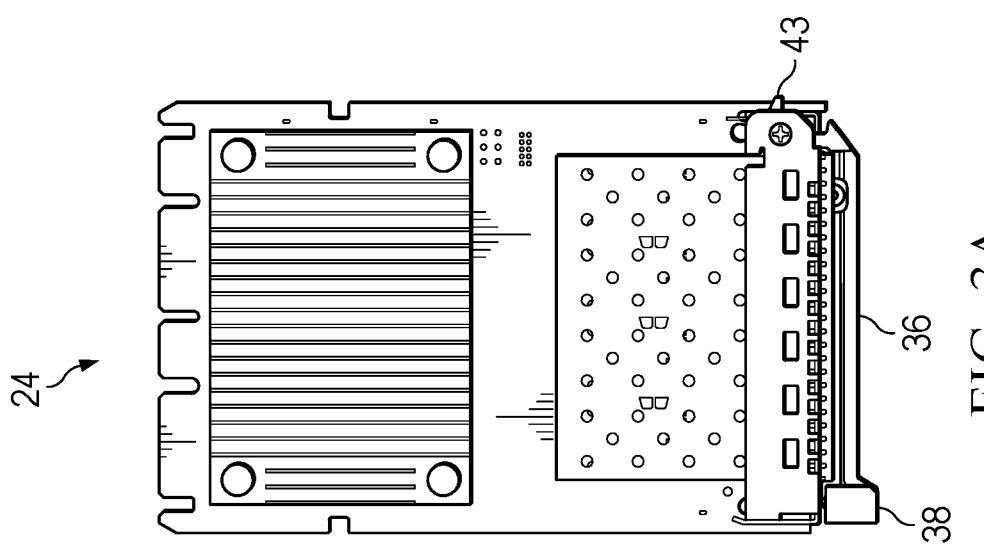

Referring now to FIGS. 3A and 3B, an upper view depicts a communication carrier 24 having a latch assembly in a secure position and a release position. FIG. 3A depicts latch 36 in the secure position coupled in place by button assembly 38 with securing member 43 extending out to engage the information handling system housing bay. FIG. 3B depicts latch 36 rotated 53.5 degrees to a release position after button assembly 38 is actuated to release latch 36. In the release position, latch 36 offers a grasp that an end user can pull on to pull communication carrier 24 out of an information handling system bay. The pitch of communication carrier 24 in the release position is 82 mm, which is optimized for CCF configurations, such as to place three OCP3.0 modules horizontally between two PSUs. A 17.8 mm module height allows two modules in a vertical stack for a 1 U node that also aids thermal performance. Button assembly 38 and latch 36 cooperate to provide within a minimum space a user friendly button and robust end user grasp device. Communication carrier 24 adapts to support a variety of storage device configurations across OCP3.0 NICs, customized SAS cards and both SFF and LFF configurations.

Figure 4:
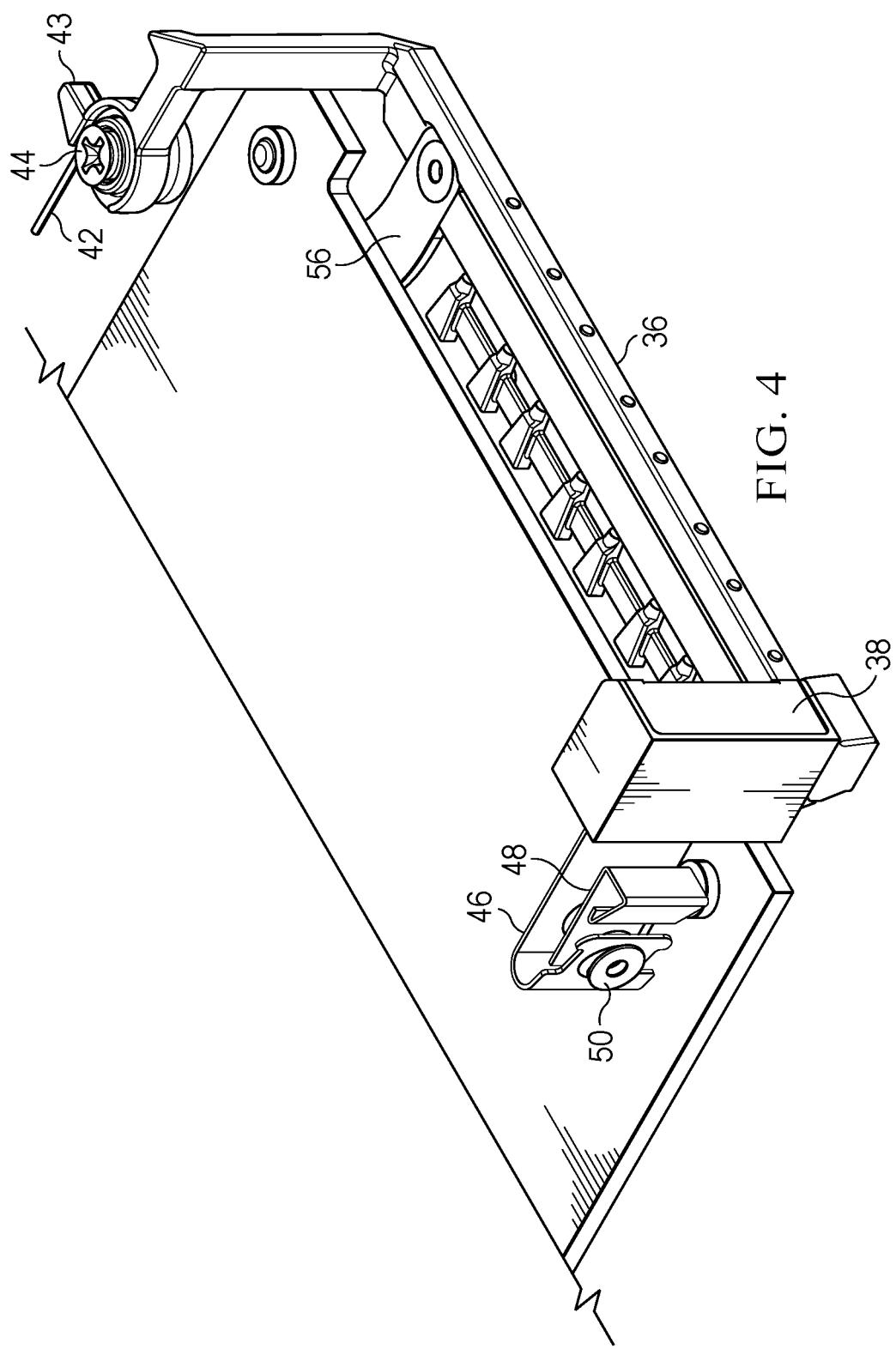
FIGS. 4 and 4A depict a front perspective view of a communication carrier latch button and pin in a secure position.
Figure 4A:
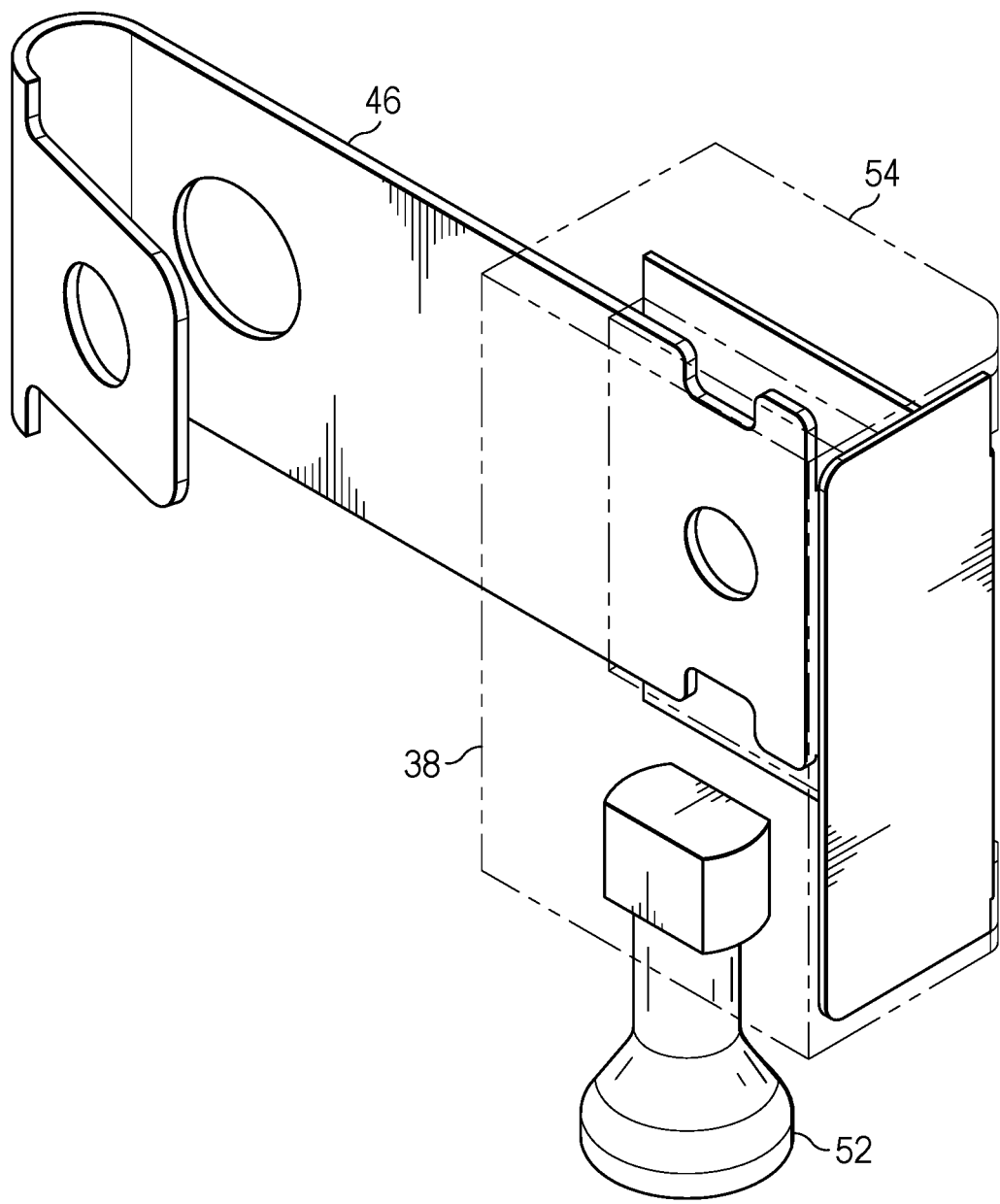

Referring now to FIGS. 4 and 4A, a front perspective view depicts a communication carrier latch button and pin in a secure position. FIG. 4 depicts a cutaway view of button assembly 38 with latch 36 rotated to the secure position. Button assembly 38 couples to the support structure with a rivet 50 inserted through an EMI finger 48 and leaf spring 46. A swing arm 56 couples to latch 36 between axle 44 and button assembly 38 to regulate the amount of rotation allowed for latch 36 to reach the release position. Torsion spring 42 engages latch 36 at axle 44 to bias latch 36 towards an open position. Button assembly 38 holds latch 36 in the secure position with leaf spring 46 inserted into a slot button assembly 38 to bias button assembly 38 laterally towards axle 44 engaged with latch 36. FIG. 4A depicts a detailed view of button assembly 38 showing leaf spring 46 inserted into a slot of button body 54 having a latch pin 52 couple at a bottom side. A chamfered surface of latch 36 couples to latch pin 52 to hold latch 36 in the secure position. A lateral push on button body 54 that overcomes the bias of leaf spring 46 pushes latch pin 52 away from latch 36 to release latch 36.

Figure 5:
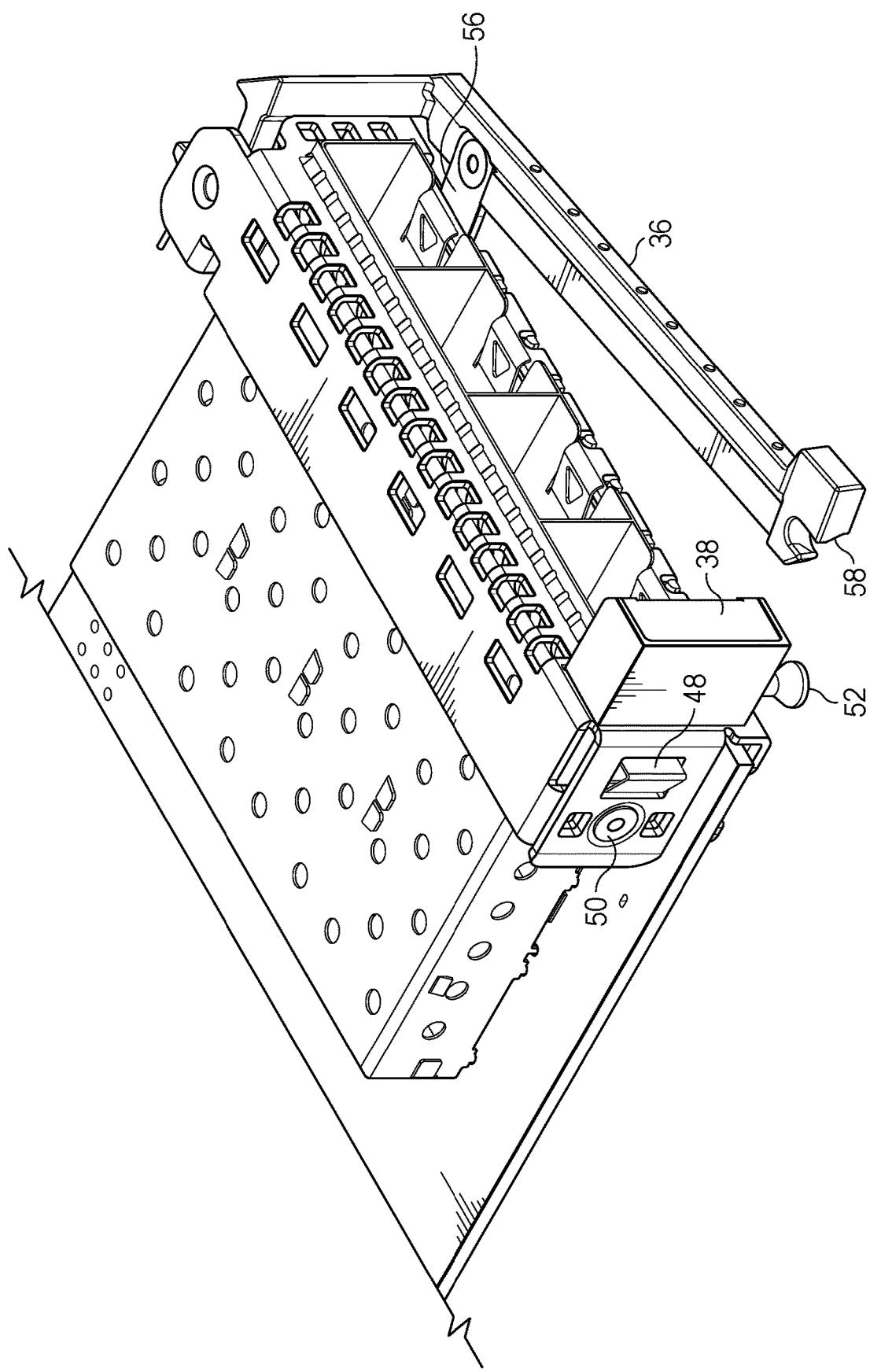
FIG. 5 depicts a front perspective view of the communication carrier latch and button with pin in a release position.

Referring now to FIG. 5, a front perspective view depicts the communication carrier latch and button with pin in a release position. In the example embodiment, a lateral push on button assembly 38 at the label surface overcomes the bias of the leaf spring to release a chamfer portion 58 of latch 36 so that the torsion spring of the axle biases latch 36 towards the release position. A press on latch 36 to engage chamfered portion 58 against latch pin 52 works the chamfered edge against latch pin 52 to overcome the bias of the leaf spring and engage latch 36 to button assembly 38. Rivet 50 secures button assembly 38 and EMI finger 48 to the support structure. Swing arm 56 regulates the rotation of latch 36 so that at a predetermined rotational angle, a pull on latch 36 translates through swing arm 56 to pull out the communication carrier from an information handling system bay. The chamfered portion 58 of latch 36 is machined to match the geometry of latch pin 52 to achieve an automated lock when latch 36 presses to a closed position and also release when latch pin 52 is pushed outward. The support structure, in addition to having venting at an upper side, is robust at the bottom side to help stabilize latch 36 to achieve optimal strength within the limited space provided.

Figure 6:
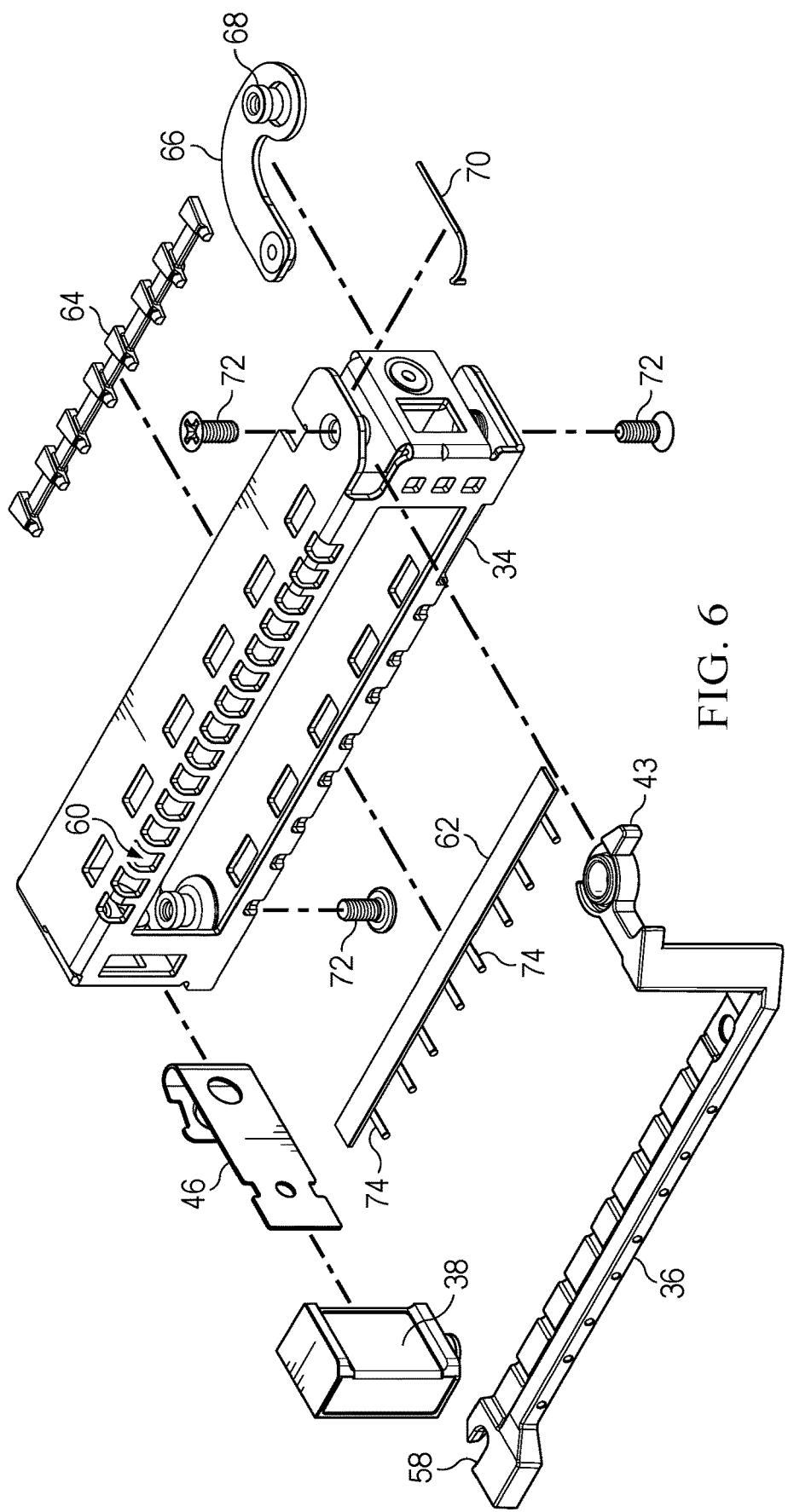
FIG. 6 depicts an exploded view of one alternative embodiment of a communication carrier and latch having illumination of the latch.

Referring now to FIG. 6, an exploded view depicts one alternative embodiment of a communication carrier support structure and latch having illumination of the latch. Support structure 34 has vents 60 formed in an upper surface and couples to latch 36 with screws 72 that insert through and axle 68 extending up from a swing arm 66. A pin spring 70 couples to swing arm 66 to bias latch 36 towards the release position. Leaf spring 46 slides at one end into button assembly 38 and couples at the opposite end to support structure 34. Latch 36 has the chamfered portion 58 at one end to couple to the pin of button assembly 38 and the secure member 43 extend out from the axle location to engage against an information handling system housing bay. A set of plural LEDs 64 generate illumination directed through openings of the support structure and towards light guides 74 that fit through openings of latch 36 and are held in place with a light guide bar 62. When latch 36 is in the secure position an LED of the set of LEDs 64 aligns with each light guide 74 to present illumination at the front face of latch 36. In the release position, light guides 74 rotate with latch 36 away from the set of LEDs 64 to stop illumination.

Figure 7:
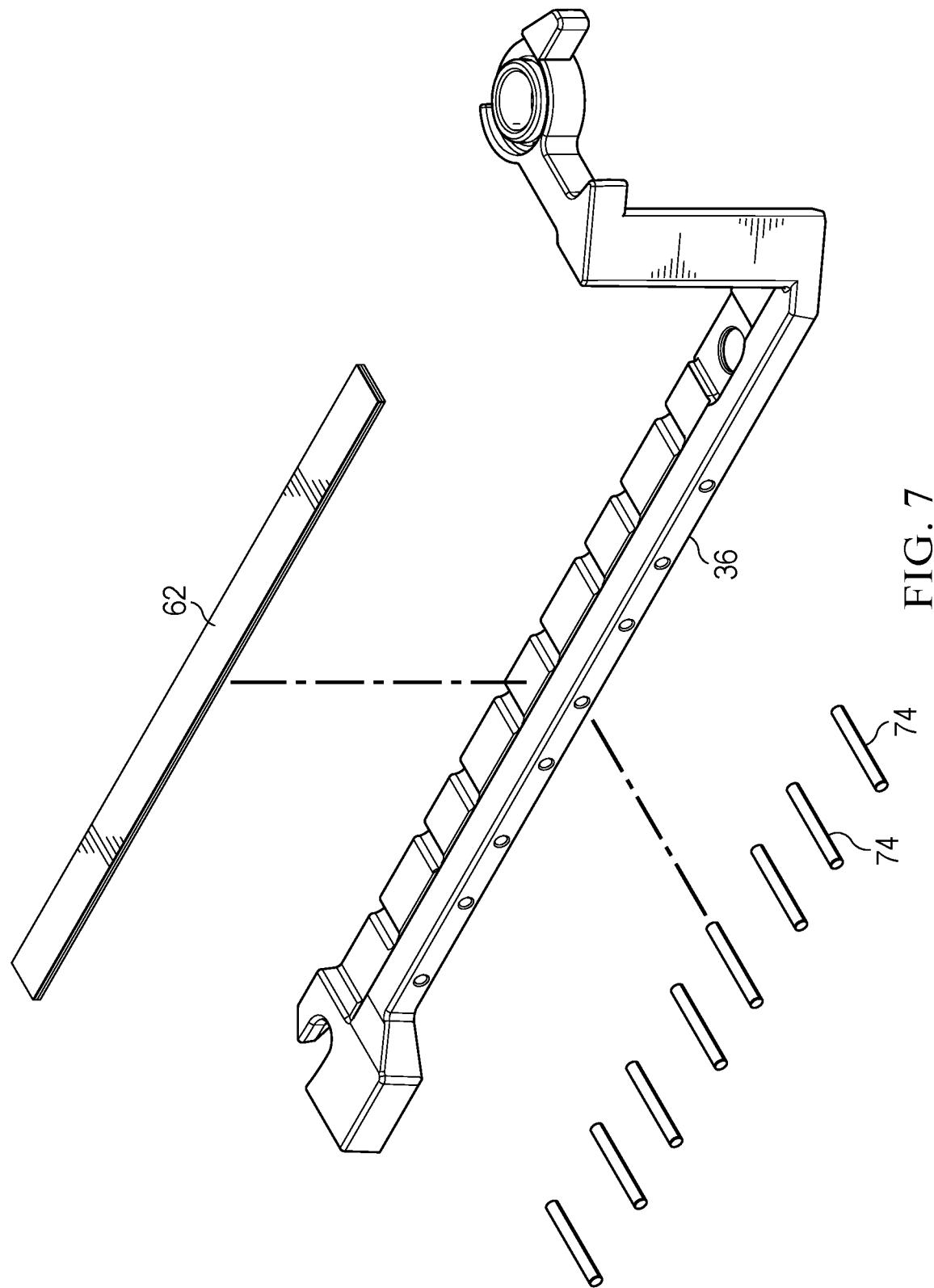
FIG. 7 depicts an exploded view of a latch having integrated light guides to illuminate the latch front side.

Referring now to FIG. 7, an exploded view depicts a latch 36 having integrated light guides 74 to illuminate the latch front side. In the example embodiment, a light guide bar 62 helps to direct illumination to light guides 74 to illuminate the latch front side. For instance, LEDs within the support structure interior direct illumination into an acrylic material of light guide bar 62 that has a reflective coating. Light guide bar 62 couples to latch 36 at the upper surface to rotate with latch 36 and have a fixed interface with the light guides 74 that direct illumination to the latch front side. In alternative embodiments, different colors might be provided at each light guide 74 by aligning each light guide 74 with individual LEDs of the support structure interior.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to execute instructions to process information;
   a memory disposed in the housing and interfaced with the processor, the memory operable to store the instructions and information; and
   plural communication carriers configured to couple to the housing and interface with the processor, each of the plural communication carriers having a support structure, the support structure supporting a printed circuit board that interfaces with the processor, plural communication ports that each accept a communication cable and a network interface controller that coordinates communication of information between the plural communication ports and the processor, the support structure having a latch that rotates about an axle between a release position and a secure position, the secure position engaging a chamfered end of the latch with a pin of a release button, the pin coupling the latch closed, the release button flexing laterally in response to a push to release the pin from the chamfered end.

2. The information handling system of claim 1 further comprising:
   a member extending from the latch end opposite the chamfered end proximate the axle, the member in the secure position engaging with the housing to couple the communication carrier to the housing;

wherein the member rotates clear of the housing when the latch rotates to the release position to release the communication carrier from the housing.

3. The information handling system of claim 2 wherein the button comprises:
a press surface coupled to the pin; and
a leaf spring extending from the support structure biasing the press surface towards the axle;
wherein a press on the press surface away from the axle overcomes the leaf spring bias to move the pin out of the chamfered end.

4. The information handling system of claim 3 further comprising a label coupled to the press surface, the label describing the network interface controller capability.

5. The information handling system of claim 3 further comprising a swing arm coupled to the latch between the axle and the chamfered end, the swing arm rotating and extending a predetermined amount when the latch rotates from the secure position towards the release position, the swing arm at the predetermined amount translating a pull on the latch to remove the communication carrier from the housing.

6. The information handling system of claim 3 further comprising a torsion spring coupled around the axle and engaged against the support structure to bias the latch towards a release position.

7. The information handling system of claim 3 wherein the button leaf spring couples to the support structure and slides into a slot behind the press surface.

8. The information handling system of claim 3 further comprising:
plural light guides inserted between a front side and rear side of the latch; and
an illumination source interfaced with the plural light guides to provide illumination to the plural light guides at the rear side for presentation of the illumination at the front side.

9. The information handling system of claim 3 further comprising vents formed in the support structure.

10. A method for coupling a communication carrier to an information handling system housing, the method comprising:
rotating a latch about an axle at a first side of the communication carrier from a release position to a secure position;
coupling a chamfered end of the latch to a pin at a second side of the communication carrier opposite the first side; and
engaging a member extending from the latch at the first side with the information handling system housing, the member rotating about the axle to extend out from the communication carrier when the latch is at the secure position.

11. The method of claim 10 further comprising:
pressing a button coupled to the pin away from the axle to release the pin from the chamfered end; and
biasing the latch towards the release position with a spring coupled to the axle.

12. The method of claim 11 further comprising:
biasing the button towards the axle with a leaf spring coupled to the button and the communication carrier, the leaf spring inserting into a slot of the button.

13. The method of claim 12 further comprising:
coupling a swing arm to the latch between the first and second sides;
stopping rotation of the latch with the swing arm after a predetermined amount; and
pulling the communication carrier from the information handling system housing by pulling on the latch after the predetermined amount of rotation.

14. The method of claim 11 further comprising:
forming vents in a support structure that supports the axle, latch and button; and
passing air through the vents to aid in cooling of processing components within the communications carrier.

15. The method of claim 11 further comprising:
generating illumination within the communication carrier; and
directing the illumination to a front side of the communication carrier through light guides inserted through the latch.

16. A communications carrier configured to couple to an information handling system bay, the communications carrier comprising:
a support structure;
an axle coupled to first side of the support structure;
a latch coupled to the axle to rotate between secure and release positions, the latch having a member at a first end proximate the axle that extends outward when the latch rotates to the secure position to engage with the information handling system bay and a chamfer at a second end opposite the first end, the chamfer configured to engage a pin; and
a button coupled to the support structure at a second side opposite the first side, the button having a pin aligned to couple with the chamfer in the secure position, the button moving away from the pin in response to a press to release the latch from the pin.

17. The communication carrier of claim 16 further comprising:
a leaf spring coupled at a first end to the support structure and inserted at a second end into a slot of the button to bias the button towards the latch; and
a torsion spring coupled to the axle and configured to bias the latch towards the release position.

18. The communication carrier of claim 17 further comprising a swing arm coupled to the latch between the first and second ends, the swing arm stopping rotation towards the release position after a predetermined amount of rotation and translating rotational force applied to the latch to remove the communication carrier from the information handling system bay.

19. The communication carrier of claim 18 further comprising vents formed in the support structure above the latch to flow air into the communication carrier.

20. The communication carrier of claim 19 further comprising plural light guides passing through the latch and configured to direct illumination from an interior of the support structure to a front face of the latch.

* * * * *